United States Patent
Chen et al.

(10) Patent No.: US 11,932,790 B2
(45) Date of Patent: *Mar. 19, 2024

(54) RED LIGHT AND NEAR-INFRARED LIGHT-EMITTING MATERIAL, PREPARATION METHOD THEREOF AND LIGHT-EMITTING DEVICE

(71) Applicant: Grirem Advanced Materials Co., Ltd, Beijing (CN)

(72) Inventors: Xiaoxia Chen, Beijing (CN); Yuanhong Liu, Beijing (CN); Ronghui Liu, Beijing (CN); Yuan Xue, Beijing (CN)

(73) Assignee: GRIREM ADVANCED MATERIALS CO., LTD., Beijing (CN)

( * ) Notice: Subject to any disclaimer, the term of this patent is extended or adjusted under 35 U.S.C. 154(b) by 347 days.

This patent is subject to a terminal disclaimer.

(21) Appl. No.: 17/254,224

(22) PCT Filed: Jul. 9, 2019

(86) PCT No.: PCT/CN2019/095238
§ 371 (c)(1),
(2) Date: Dec. 18, 2020

(87) PCT Pub. No.: WO2020/177257
PCT Pub. Date: Sep. 10, 2020

(65) Prior Publication Data
US 2021/0388262 A1    Dec. 16, 2021

(30) Foreign Application Priority Data

Mar. 6, 2019   (CN) .......................... 201910614524.2

(51) Int. Cl.
*C09K 11/77*   (2006.01)
*C01G 15/00*   (2006.01)
*H01L 33/50*   (2010.01)

(52) U.S. Cl.
CPC ........ *C09K 11/7708* (2013.01); *C01G 15/006* (2013.01); *C09K 11/7776* (2013.01);
(Continued)

(58) Field of Classification Search
CPC ..... C09K 11/7708; C09K 11/62; C09K 11/68; C09K 11/685
See application file for complete search history.

(56) References Cited

FOREIGN PATENT DOCUMENTS

| CN | 102127813 A | 7/2011 |
|----|-------------|--------|
| CN | 102618928 A | 8/2012 |

(Continued)

OTHER PUBLICATIONS

Kefalos. Energy Transfer From Gd3+ tO Cr3+ in Cr-Doped Gd3Sc2Ga3O12. University of Connecticut ProQuest Dissertations Publishing. 1996 retrieved from:https://www.proquest.com/openview/c0ab2b623e916bcde45fd5ac4dc4904d/1?pq-origsite=gscholar&cbl=18750&diss=y on Oct. 17, 2023 (Year: 1994).*

(Continued)

*Primary Examiner* — Matthew E. Hoban
(74) *Attorney, Agent, or Firm* — Westbridge IP LLC

(57) ABSTRACT

Disclosed are a red light and near-infrared light-emitting material and a preparation method thereof, and a light-emitting device including the light-emitting material. The red light and near-infrared light-emitting material contains a compound represented by a molecular formula, $aSc_2O_3 \cdot Ga_2O_3 \cdot bR_2O_3$, wherein the element R includes one or two of Cr, Ni, Fe, Yb, Nd or Er; $0.001 \leq a \leq 0.6$; and $0.001 \leq b \leq 0.1$. The light-emitting material can be excited by a spectrum having a wide wavelength range (ultraviolet light or purple light or blue light) to emit light with a wide spectrum of 650 nm to 1700 nm or multiple spectra, thus having higher light-emitting intensity.

19 Claims, 3 Drawing Sheets

(52) U.S. Cl.
CPC ........ *H01L 33/502* (2013.01); *C01P 2002/52* (2013.01); *C01P 2002/72* (2013.01); *H01L 2933/0041* (2013.01)

(56) References Cited

FOREIGN PATENT DOCUMENTS

| | | |
|---|---|---|
| CN | 102618929 A | 8/2012 |
| CN | 103571473 A | 2/2014 |
| CN | 106833627 A | 6/2017 |
| CN | 107674673 * | 2/2018 |

OTHER PUBLICATIONS

Kuz'micheva. Preparation and Structure of Ga2—xScxO3 (0.42 ≤ x ≤ 0.52). Inorganic Materials, vol. 40, No. 10, 2004, pp. 1066-1069. Translated from Neorganicheskie Materialy, vol. 40, No. 10, 2004, pp. 1216-1219. (Year: 2004).*
International Search Report of PCT/CN2019/095238.
Written Opinion of PCT/CN2019/095238.

* cited by examiner

RED LIGHT AND NEAR-INFRARED LIGHT-EMITTING MATERIAL, PREPARATION METHOD THEREOF AND LIGHT-EMITTING DEVICE

CROSS-REFERENCE TO RELATED APPLICATIONS

This application is a national stage application of PCT/CN2019/095238. This application claims priorities from PCT Application No. PCT/CN2019/095238, filed Jul. 9, 2019, and from the Chinese patent application 201910614524.2 filed Jul. 9, 2019, on the contents of which are incorporated herein in the entirety by reference.

TECHNICAL FIELD

The present invention relates to the field of light-emitting materials, and more particularly to a red light and near-infrared light-emitting material, a preparation method thereof and a light-emitting device.

BACKGROUND

In recent years, the applications of near-infrared light in such fields as security monitoring, biometric identification, 3D sensing, and food/medical detection have become a focus at home and abroad. In particular, a wide spectrum of 650 nm to 1050 nm covers frequency doubling and combining characteristic information of vibrations of hydrogen-containing groups (O—H, N—H, and C—H). By scanning a near-infrared wide spectrum of a sample, the characteristic information of hydrogen-containing groups of organic molecules in the sample may be obtained, and may be widely used in the field of food detection. Wide spectra of 850 nm to 1000 nm and 1400 nm to 1700 nm or multiple spectra may be used in such fields as medical detection, biometric identification and security monitoring.

Since Osram launched a blue light chip in combination with near-infrared phosphor for the first time in the world in 2016 for the application of a near-infrared light source with a wide spectrum of 650 nm to 1050 nm in the field of food detection, a fluorescence-converted near-infrared technology has been developed rapidly and a near-infrared light-emitting material has become a research focus. In terms of red light and near-infrared light-emitting materials, a public report, "*LaAlO$_3$:Mn$^{4+}$ as Near-Infrared Emitting Persistent Luminescence Phosphor for Medical Imaging: A Charge Compensation Study* (Materials 2017, 10, 1422)", discloses a phosphor whose chemical composition is LaAlO$_3$:Mn$^{4+}$, which may emit red light with a spectrum of 600 nm to 800 nm under the excitation of ultraviolet light, and the range of the luminescence spectrum is narrow and cannot be excited by blue light. The patent "Near Infrared Doped Phosphors Having an Alkaline Gallate Matrix" (EP2480626A2) discloses a phosphor which has a composition of LiGaO$_2$: 0.001Cr$^{3+}$, 0.001Ni$^{2+}$, may emit near-infrared light with a spectrum between 1000 nm and 1500 nm under UV excitation, and has a narrow range of the luminescence spectrum and low luminescent intensity. This phosphor has a long afterglow effect. The luminescence duration lasts for several minutes, so this phosphor is not suitable for manufacturing a light-emitting device. "*Research on Near-Infrared Quantum Tailoring of Rare Earth Ions doped with CaWO$_4$ Phosphor*" (Master's thesis of Taiyuan University of Technology, Li Yunqing, 2015) discloses a phosphor which has a chemical composition of CaWO$_4$:1% Yb$^{3+}$ and may emit near-infrared light with a spectrum of 900 nm to 1100 nm under UV excitation. This phosphor has a narrow range of the luminescence spectrum and low luminescent intensity, and cannot be excited by blue light. In "*The Preparation and Light-emitting Properties of Near-Infrared Phosphors Ca$_3$Sc$_2$Si$_3$O$_{12}$:Ce$^{3+}$, Nd$^{3+}$*" (Journal of the Chinese Ceramic Society, Vol. 38, No. 10, 2010), it is believed that under the excitation of blue light, the phosphor, Ca$_3$Sc$_2$Si$_3$O$_{12}$:Ce$^{3+}$, Nd$^{3+}$ may emit near-infrared light with a spectrum between 800 nm to 1100 nm, such that the luminescent intensity is low.

In summary, the followings can be seen from the existing disclosed patents or non-patent literatures: 1. there is still a lack of materials that can be excited by ultraviolet, blue and red light sources, especially by technically mature blue light sources to emit red light and near-infrared light with a high-intensity wide spectrum or multiple spectra; 2. there is still a lack of devices which are based on a single excitation light source and encapsulated in a simple manner and can emit red light and near-infrared light with a wide spectrum or multiple spectra. Therefore, it is very necessary to develop a light-emitting material that can be excited by a variety of light sources/bands, especially by blue light, and that has a relatively high luminescent intensity and can emit red light and near-infrared light with a wide spectrum or multiple spectra. Moreover, this material is used to manufacture a device which is applied in a near-infrared detection technology and serves to the fields of security monitoring, biometrics, 3D sensing, and food/medical detection.

SUMMARY

(1) Objectives of the Invention

The problem to be solved by the present invention is to overcome the defects of the above-mentioned light-emitting materials. One of the objectives of the present invention is to obtain a red light and near-infrared light-emitting material and a preparation method thereof. Compared with the existing red light and near-infrared light-emitting materials, this material may emit with a wide spectrum of 650 nm to 1700 nm or multiple spectra under the excitation of a spectrum with a wide wavelength range (ultraviolet light or purple light or blue light). Further, another objective of the present invention is to provide a device which may emit red light and near-infrared light in a range of 650 nm to 1700 nm using a single excitation light source and the light-emitting material of the present invention. To achieve the above objectives, the present invention provides a red light and near-infrared light-emitting material, a preparation method thereof, and a light-emitting device including the material.

(II) Technical Solutions

A first aspect of the present invention provides a red light and near-infrared light-emitting material, which contains a compound represented by a molecular formula, aSc$_2$O$_3$·Ga$_2$O$_3$·bR$_2$O$_3$, wherein the element R includes one or two of Cr, Ni, Fe, Yb, Nd or Er; 0.001≤a≤0.6; and 0.001≤b≤0.1.

Further, the compound has a crystal structure which is the same as β-Ga$_2$O$_3$.

Further, 0.15≤a≤0.35 and 0.02≤b≤0.05.

Further, the element R includes Cr.

Further, the element R is Cr.

Further, R further includes one or two of Ce, Eu, Tb, Bi, Dy and Pr.

A second aspect of the present invention provides a preparation method of the aforementioned red light and near-infrared light-emitting material, the method including:

weighing raw materials $Sc_2O_3$, $Ga_2O_3$ and $R_2O_3$ according to stoichiometric ratios of molecular formula;

placing the aforementioned raw materials into a crucible after grinding and evenly mixing, and sintering the raw materials in a high-temperature furnace at a temperature of 1200° C. to 1600° C. for 2 hours to 10 hours under a protective atmosphere of air or nitrogen;

cooling in the furnace to room temperature to obtain a sintered sample; and ball-milling, water-washing and sieving the sample to obtain the red light and near-infrared light-emitting material.

A third aspect of the present invention provides a light-emitting device which at least includes an excitation light source and a light-emitting material, wherein the light-emitting material at least includes the aforementioned red light and near-infrared light-emitting material.

Further, the peak luminous wavelengths of the excitation light source ranges from 250 nm to 320 nm, from 400 nm to 500 nm, and from 550 nm to 700 nm.

Further, the peak luminous wavelength of the excitation light source ranges from 440 nm to 470 nm.

(III) Beneficial Effects

The above technical solutions of the present invention have the following beneficial technical effects.

1. The present invention provides a material and a light-emitting device that can emit red light and near-infrared light with a high-intensity wide spectrum or multiple spectra.

2. The light-emitting material may be excited by ultraviolet light, blue light and red light sources to generate a wide spectrum or multiple spectra.

3. The light-emitting material can be excited by a technically mature blue light source to emit light with a high-intensity wide spectrum or multiple spectra, and has a higher luminescent intensity than the existing materials.

DETAILED DESCRIPTION

Figure 1:
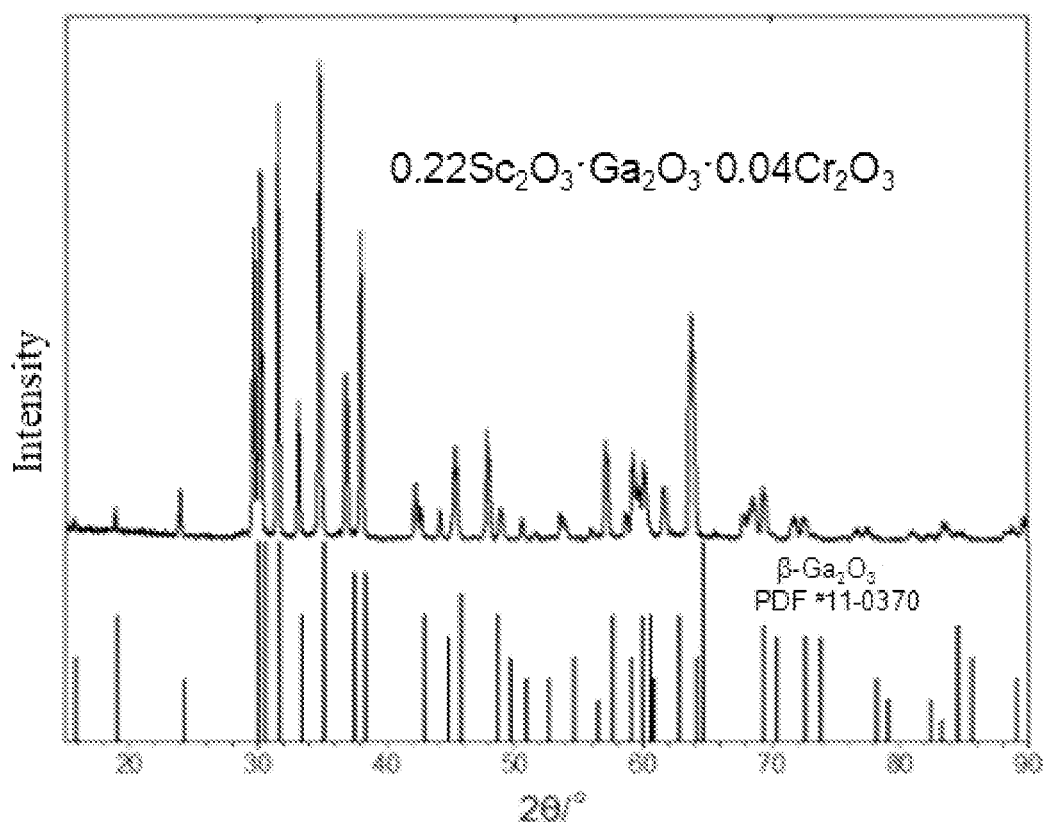
FIG. 1 shows an XRD diffraction pattern of a light-emitting material obtained in Embodiment 1 of the present invention.

For clearer description of the objectives, technical solutions, and advantages of the present invention, the present invention will be further described in detail below in combination with specific implementations and with reference to the accompanying drawings. It should be understood that these descriptions are only exemplary and not intended to limit the scope of the present invention. In addition, in the following description, the description of well-known structures and technologies is omitted to avoid unnecessary confusion of the concepts in the present invention.

A first aspect of the present invention provides a red light and a near-infrared light-emitting material, which includes a compound represented by a molecular formula, $aSc_2O_3 \cdot Ga_2O_3 \cdot bR_2O_3$, wherein the element R includes one or two of Cr, Ni, Fe, Yb, Nd or Er; $0.001 \leq a \leq 0.6$; and $0.001 \leq b \leq 0.1$.

Preferably, the compound, $aSc_2O_3 \cdot Ga_2O_3 \cdot bR_2O_3$, has a crystal structure which is the same as $\beta$-$Ga_2O_3$. $Ga_2O_3$ has five isomers such as $\alpha$, $\beta$, and $\gamma$. Among them, $\beta$-$Ga_2O_3$ is the most stable, has a monoclinic crystal structure, and has the characteristics of stable chemical properties and easy doping of cations. In the present invention, $\beta$-$Ga_2O_3$ may emit red light and near-infrared light by introducing transition metal or rare earth metal ions. In addition, the spectrum can be adjusted and controlled by a substitution of other congeners.

Preferably, for the red light and near-infrared light-emitting material, further value ranges of a and b meet the following conditions: $0.15 \leq a \leq 0.35$, and $0.02 \leq b \leq 0.05$.

The red light and near-infrared light-emitting material of the present invention is characterized in that $\beta$-$Ga_2O_3$ is doped with Sc which has a larger atomic radius and replaces a Ga cation, so that lattices of $\beta$-$Ga_2O_3$ expand, and the length of a bond between an ion in a luminescent center and an O anion increases. Thus, the crystal field intensity is weakened or the crystal field is split for wide-spectrum or multi-spectrum emission of Cr ions. With the increase in content of Sc ions, movement of long waves in the spectrum is realized. When the content of $Sc_2O_3$, a, meets the condition: $0.15 \leq a \leq 0.35$, the light-emitting material of the present invention is of a $\beta$-$Ga_2O_3$ structure, and has a higher luminescent intensity. When a is less than 0.15, the luminescent intensity is slightly lower; and when a exceeds 0.35, it is possible to generate an impurity phase. When the element R in $R_2O_3$ serves as a luminescent center and the composition meets the condition: $0.02 \leq b \leq 0.05$, the light-emitting material of the present invention has an optimal luminescent intensity. In the case of $b<0.02$, the luminescent intensity is low because there are too few luminescent centers. In the case of $b>0.05$, the concentration of the luminescent centers is too high, which will cause concentration quenching, thus also reducing the luminescent intensity. Preferably, for the red light and near-infrared light-emitting material, the element R includes Cr.

Preferably, for the red light and near-infrared light-emitting material, the element R is Cr. The transition metal ion $Cr^{3+}$ has a radius similar to that of $Ga^{3+}$, and is thus easily doped into a distorted octahedral structure of $Ga^{3+}$. In addition, the energy level of $Cr^{3+}$ may decrease as the strength of the crystal field weakens, which enables the movement of the long waves in the spectrum and wide-peak emission, thereby emitting light with a near-infrared wide spectrum.

Preferably, the red light and near-infrared light-emitting material further includes one or two of Ce, Eu, Tb, Bi, Dy and Pr. The introduction of one or two of Ce, Eu, Tb, Bi, Dy, and Pr can cause an energy transfer of such element or elements to the element R in the luminescent center to obtain more intensive red light and near-infrared light.

A second aspect of the present invention provides a preparation method of the aforementioned red light and near-infrared light-emitting material, the method including:

weighing raw materials $Sc_2O_3$, $Ga_2O_3$ and $R_2O_3$ according to stoichiometric ratios of molecular formula;

placing the aforementioned raw materials into a crucible after grinding and evenly mixing, and sintering the raw materials in a high-temperature furnace at a temperature of 1300° C. to 1500° C. for 2 hours to 10 hours under a protective atmosphere of air or nitrogen;

cooling in the furnace to room temperature to obtain a sintered sample; and ball-milling, water-washing and sieving the sample to obtain the red light and near-infrared light-emitting material.

A third aspect of the present invention provides a light-emitting device which can be manufactured with the aforementioned red light and near-infrared light-emitting material in combination with an excitation light source. Preferably, for the light-emitting device, a peak luminous wavelength of the excitation light source range from 250 nm to 320 nm, from 400 nm to 500 nm, or from 550 nm to 700 nm, preferably from 440 nm to 470 nm.

In order to further explain the present invention, the red light and near-infrared light-emitting material and the preparation method thereof provided by the present invention will be described in detail below in combination with the embodiments. However, it should be understood that these embodiments are implemented on the premise of the technical solutions of the present invention. The detailed implementations and specific operation procedures are provided to further explain the features and advantages of the present invention, but not to limit the claims of the present invention. The protection scope of the present invention is not limited to the following embodiments.

The devices and reagents used in the following embodiments are commercially available.

COMPARATIVE EXAMPLE

According to a stoichiometric ratio of a chemical formula, $Sc_{0.98}BO_3:0.02Cr$, raw materials $Sc_2O_3$, $H_3BO_3$ and $Cr_2O_3$ are accurately weighed and evenly mixed to obtain a mixture. The obtained mixture is sintered at 1300° C. for 8 hours in an air atmosphere, and cooled to obtain a sintered product; the sintered product is subjected to post-processing, such as sieving and water-washing, to obtain a near-infrared light-emitting material sample.

A 460-nm excitation test is performed on the obtained near-infrared light-emitting material sample to obtain the results that an emission peak of the comparative example is at 810 nm and that a half-peak width is 133 nm. The relative luminescent intensity is set to be 100.

Embodiment 1

According to a stoichiometric ratio of a chemical formula, $0.22Sc_2O_3 \cdot Ga_2O_3 \cdot 0.04Cr_2O_3$, raw materials $Sc_2O_3$, $Ga_2O_3$ and $Cr_2O_3$ are accurately weighed. And then, the raw materials are ground and mixed evenly and placed into a crucible. The raw materials are sintered in a high-temperature furnace at 1450° C. for 8 hours in an air atmosphere and cooled to room temperature in the furnace to obtain a sample. After the sample is ball-milled, washed with water and sieved, the red light and near-infrared light-emitting material of Embodiment 1 is obtained. An X-ray diffraction is used to analyze the light-emitting material obtained in Embodiment 1, so as to obtain an X-ray diffraction pattern of the light-emitting material. As shown in FIG. 1, the diffraction pattern is the same as that of β-$Ga_2O_3$ shown on PDF Card No. 11-0370, except that the overall diffraction peak is shifted slightly to a small angle, indicating that the light-emitting material in Embodiment 1 is of a β-$Ga_2O_3$ structure. With the introduction of Sc, a solid solution of β-$Ga_2O_3$ doped with Sc is obtained, with lattices thereof expanding and the space between lattice planes increasing.

Figure 2:
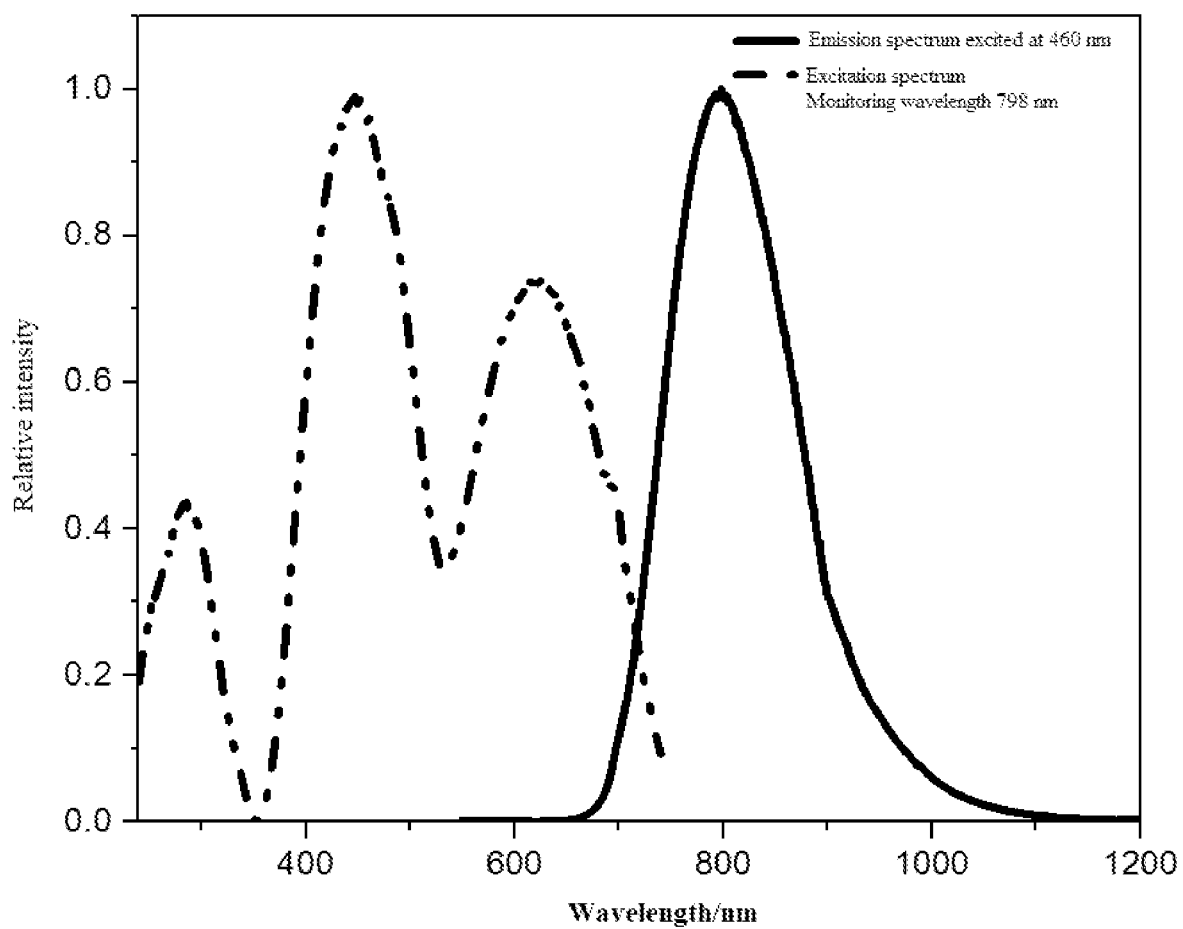
FIG. 2 shows an excitation emission spectrum of the light-emitting material obtained in Embodiment 1 of the present invention.

The light-emitting material obtained in Embodiment 1 is analyzed with a fluorescence spectrometer, and is excited by blue light at 460 nm to obtain a luminescent spectrum. The material can emit red light and near-infrared light with a wide spectrum of 650 nm to 1050 nm under the excitation of the blue light, with a peak wavelength being 798 nm and a half-peak width being 141 nm. The excitation spectrum of the material is obtained by monitoring the light emission at 798 nm, as shown in FIG. 2. It can be seen that the light-emitting material can be effectively excited by ultraviolet light, purple light, blue light and red light, and emit red light and near-infrared light with a wide spectrum. The relative luminescent intensity of the light-emitting material is 309.

Embodiment 2

According to a stoichiometric ratio of a chemical formula, $0.001Sc_2O_3 \cdot Ga_2O_3 \cdot 0.04Cr_2O_3$, raw materials $Sc_2O_3$, $Ga_2O_3$ and $Cr_2O_3$ are accurately weighed. And then, the raw materials are ground and mixed evenly and placed into a crucible. The raw materials are sintered in a high-temperature furnace at 1490° C. for 8 hours in an air atmosphere and cooled to room temperature in the furnace to obtain a sample. After the sample is ball-milled, washed with water and sieved, the red light and near-infrared light-emitting material of Embodiment 2 is obtained.

Figure 3:
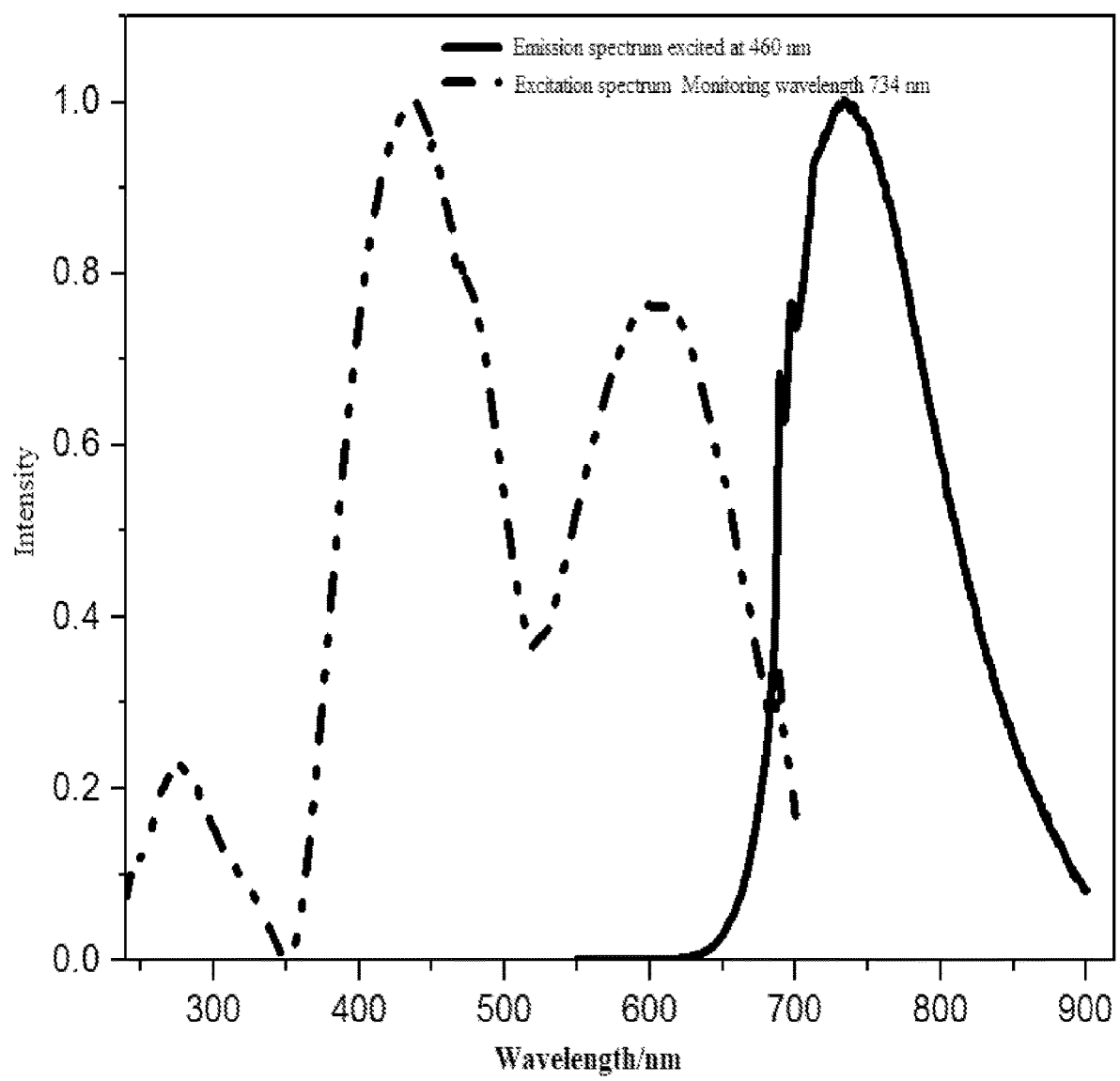
FIG. 3 shows an excitation emission spectrum of the light-emitting material obtained in Embodiment 2 of the present invention.

The light-emitting material obtained in Embodiment 2 is analyzed with a fluorescence spectrometer, and excited by blue light at 460 nm to obtain a luminescent spectrum. The material can emit red light and near-infrared light with a wide spectrum of 650 nm to 900 nm under the excitation of the blue light, with a peak wavelength being 734 nm and a half-peak width being 121 nm. An excitation spectrum of the material is obtained by monitoring the light emission at 734 nm, as shown in FIG. 3. It can be seen that the light-emitting material can be effectively excited by ultraviolet light, purple light, blue light and red light, and emit red light and near-infrared light with a wide spectrum. The relative luminescent intensity of the material is 245.

Embodiment 3

According to a stoichiometric ratio of a chemical formula, $0.6Sc_2O_3 \cdot Ga_2O_3 \cdot 0.04Cr_2O_3$, raw materials $Sc_2O_3$, $Ga_2O_3$ and $Cr_2O_3$ are accurately weighed. And then, the raw materials are ground and mixed evenly and placed into a crucible. The raw materials are sintered in a high-temperature furnace at 1600° C. for 8 hours in an air atmosphere and cooled to room temperature in the furnace. After the sample is ball-milled, washed with water and sieved, the red light and near-infrared light-emitting material of Embodiment 3 is obtained.

The light-emitting material obtained in Embodiment 3 is analyzed with a fluorescence spectrometer, and excited by blue light at 460 nm to obtain a luminescent spectrum. The material can emit red light and near-infrared light with a wide spectrum of 700 nm to 1050 nm under the excitation of blue light, with a peak wavelength being 830 nm and a half-peak width being 143 nm. The relative luminescent intensity of the material is 258.

For the red light and near-infrared light-emitting materials described in Embodiments 4 to 22, the chemical formulas of the compounds are listed in Table 1 below. The preparation method of the material in each of other embodiments is the same as that in Embodiment 1: the compounds with appropriate stoichiometric ratios are selected just according to the composition of chemical formulas of the target compound in each embodiment to be mixed, ground and sintered under appropriate conditions to obtain the desired near-infrared light-emitting material.

The performances of the light-emitting materials prepared in various embodiment and in the comparative example are tested. The light-emitting properties in test results of the comparative example and Embodiments 1 to 22 excited at 460 nm are shown in Table 1 below.

TABLE 1

| No. | Molecular formula/Material | Peak position (nm) | Half-peak width (nm) | Relative luminescent intensity |
|---|---|---|---|---|
| Comparative example | $Sc_{0.98}BO_3:0.02Cr$ | 810 | 133 | 100 |
| Embodiment 1 | $0.22Sc_2O_3 \cdot Ga_2O_3 \cdot 0.04Cr_2O_3$ | 798 | 141 | 309 |
| Embodiment 2 | $0.001Sc_2O_3 \cdot Ga_2O_3 \cdot 0.04Cr_2O_3$ | 734 | 121 | 245 |
| Embodiment 3 | $0.6Sc_2O_3 \cdot Ga_2O_3 \cdot 0.04Cr_2O_3$ | 830 | 143 | 258 |
| Embodiment 4 | $0.3Sc_2O_3 \cdot Ga_2O_3 \cdot 0.001Cr_2O_3$ | 816 | 130 | 167 |
| Embodiment 5 | $0.3Sc_2O_3 \cdot Ga_2O_3 \cdot 0.1Cr_2O_3$ | 816 | 130 | 186 |
| Embodiment 6 | $0.15Sc_2O_3 \cdot Ga_2O_3 \cdot 0.04Cr_2O_3$ | 775 | 140 | 264 |
| Embodiment 7 | $0.35Sc_2O_3 \cdot Ga_2O_3 \cdot 0.04Cr_2O_3$ | 808 | 139 | 278 |
| Embodiment 8 | $0.23Sc_2O_3 \cdot Ga_2O_3 \cdot 0.04Cr_2O_3 0.04Yb_2O_3$ | 802, 1000 | 33 (1000 nm) | 112 (1000 nm) |
| Embodiment 9 | $0.23Sc_2O_3 \cdot Ga_2O_3 \cdot 0.04Cr_2O_3 0.04Nd_2O_3$ | 802, 1000 | 35 (1000 nm) | 114 (1000 nm) |
| Embodiment 10 | $0.23Sc_2O_3 \cdot Ga_2O_3 \cdot 0.04Cr_2O_3 0.04Er_2O_3$ | 803, 1550 | 33 (1550 nm) | 116 (1550 nm) |
| Embodiment 11 | $0.25Sc_2O_3 \cdot Ga_2O_3 \cdot 0.01Cr_2O_3$ | 809 | 142 | 305 |
| Embodiment 12 | $0.22Sc_2O_3 \cdot Ga_2O_3 \cdot 0.02Cr_2O_3$ | 805 | 143 | 303 |
| Embodiment 13 | $0.22Sc_2O_3 \cdot Ga_2O_3 \cdot 0.05Cr_2O_3$ | 805 | 141 | 300 |
| Embodiment 14 | $0.4Sc_2O_3 \cdot Ga_2O_3 \cdot 0.04Cr_2O_3$ | 826 | 140 | 256 |
| Embodiment 15 | $0.5Sc_2O_3 \cdot Ga_2O_3 \cdot 0.03Cr_2O_3$ | 826 | 142 | 286 |
| Embodiment 16 | $0.1Sc_2O_3 \cdot Ga_2O_3 \cdot 0.03Cr_2O_3$ | 792 | 143 | 306 |
| Embodiment 17 | $0.2Sc_2O_3 \cdot Ga_2O_3 \cdot 0.06Cr_2O_3$ | 796 | 143 | 305 |
| Embodiment 18 | $0.2Sc_2O_3 \cdot Ga_2O_3 \cdot 0.08Cr_2O_3$ | 796 | 139 | 304 |
| Embodiment 19 | $0.01Sc_2O_3 \cdot Ga_2O_3 \cdot 0.05Cr_2O_3$ | 740 | 143 | 305 |
| Embodiment 20 | $0.04Sc_2O_3 \cdot Ga_2O_3 \cdot 0.05Cr_2O_3$ | 746 | 142 | 304 |
| Embodiment 21 | $0.08Sc_2O_3 \cdot Ga_2O_3 \cdot 0.05Cr_2O_3$ | 750 | 143 | 304 |
| Embodiment 21 | $0.12Sc_2O_3 \cdot Ga_2O_3 \cdot 0.05Cr_2O_3$ | 758 | 142 | 304 |
| Embodiment 22 | $0.16Sc_2O_3 \cdot Ga_2O_3 \cdot 0.05Cr_2O_3$ | 775 | 143 | 304 |

It can be seen from the above table that the light-emitting material of the present invention has the characteristics of wide-spectrum emission or multi-spectrum emission of red light and near-infrared light under the excitation of blue light. Compared with the existing near-infrared light-emitting material in the comparative example, the red light and near-infrared light-emitting material of the present invention has a higher luminescent intensity.

In summary, the present invention provides a red light and near-infrared light-emitting material and a preparation method thereof, and a light-emitting device including the light-emitting material. The red light and near-infrared light-emitting material contains a compound represented by a molecular formula, $aSc_2O_3 \cdot Ga_2O_3 \cdot bR_2O_3$, wherein the element R includes one or two of Cr, Ni, Fe, Yb, Nd or Er; $0.001 \leq a \leq 0.6$; and $0.001 \leq b \leq 0.1$. The light-emitting material can be excited by a spectrum with a wide range of wavelengths (ultraviolet light or purple light or blue light) to emit light with a wide spectrum of 650 nm to 1700 nm or multiple spectra, thus having a higher light-emitting intensity.

It should be understood that the foregoing specific embodiments of the present invention are only used as examples to illustrate or explain the principles of the present invention, and do not constitute a limitation to the present invention. Therefore, any modifications, equivalent substitutions or improvements that are made within the spirit and scope of the present invention should all be included in the protection scope of the present invention. In addition, the appended claims of the present invention are intended to cover all changes and modifications that fall within the scope and boundary of the appended claims, or equivalent forms of such scope and boundary.

The invention claimed is:

1. A red light and near-infrared light-emitting material, containing a compound represented by a molecular formula, $aSc_2O_3 \cdot Ga_2O_3 \cdot bR_2O_3$, wherein the element R comprises one or two of Cr, Ni, Fe, Yb, Nd or Er; $0.001 \leq a \leq 0.6$; and $0.001 \leq b \leq 0.1$.

2. The red light and near-infrared light-emitting material according to claim 1, wherein the compound has a crystal structure which is the same as $\beta$-$Ga_2O_3$.

3. The red light and near-infrared light-emitting material according to claim 2, wherein, $0.15 \leq a \leq 0.35$, and $0.02 \leq b \leq 0.05$.

4. The red light and near-infrared light-emitting material according to claim 1, wherein the element R comprises Cr.

5. The red light and near-infrared light-emitting material according to claim 4, wherein the element R is Cr.

6. The red light and near-infrared light-emitting material according to claim 1, wherein the element R further comprises one or two of Ce, Eu, Tb, Bi, Dy and Pr.

7. A preparation method of the red light and near-infrared light-emitting material according to claim 1, comprising:
weighing raw materials $Sc_2O_3$, $Ga_2O_3$ and $R_2O_3$ according to stoichiometric ratios of molecular formula;
placing the aforementioned raw materials into a crucible after grinding and evenly mixing, and sintering the raw materials in a high-temperature furnace at a temperature of 1200° C. to 1600° C. for 2 hours to 10 hours under a protective atmosphere of air or nitrogen;
cooling in the furnace to room temperature to obtain a sintered sample; and ball-milling, water-washing and sieving the sample to obtain the red light and near-infrared light-emitting material.

8. A light-emitting device, at least comprising an excitation light source and a light-emitting material, wherein the light-emitting material at least comprises the red light and near-infrared light-emitting material according to claim 1.

9. The light-emitting device according to claim 8, wherein peak luminous wavelengths of the excitation light source range from 250 nm to 320 nm, from 400 nm to 500 nm, and from 550 nm to 700 nm.

10. The light-emitting device according to claim 9, wherein the peak luminous wavelength of the excitation light source ranges from 440 nm to 470 nm.

11. The red light and near-infrared light-emitting material according to claim 2, wherein the element R comprises Cr.

12. The red light and near-infrared light-emitting material according to claim 3, wherein the element R comprises Cr.

13. The red light and near-infrared light-emitting material according to claim 2, wherein the element R further comprises one or two of Ce, Eu, Tb, Bi, Dy and Pr.

14. The red light and near-infrared light-emitting material according to claim 3, wherein the element R further comprises one or two of Ce, Eu, Tb, Bi, Dy and Pr.

15. The red light and near-infrared light-emitting material according to claim 4, wherein the element R further comprises one or two of Ce, Eu, Tb, Bi, Dy and Pr.

16. A preparation method of the red light and near-infrared light-emitting material according to claim 2, comprising:
weighing raw materials $Sc_2O_3$, $Ga_2O_3$ and $R_2O_3$ according to stoichiometric ratios of molecular formula;
placing the aforementioned raw materials into a crucible after grinding and evenly mixing, and sintering the raw materials in a high-temperature furnace at a temperature of 1200° C. to 1600° C. for 2 hours to 10 hours under a protective atmosphere of air or nitrogen;
cooling in the furnace to room temperature to obtain a sintered sample; and
ball-milling, water-washing and sieving the sample to obtain the red light and near-infrared light-emitting material.

17. A preparation method of the red light and near-infrared light-emitting material according to claim 3, comprising:
weighing raw materials $Sc_2O_3$, $Ga_2O_3$ and $R_2O_3$ according to stoichiometric ratios of molecular formula;
placing the aforementioned raw materials into a crucible after grinding and evenly mixing, and sintering the raw materials in a high-temperature furnace at a temperature of 1200° C. to 1600° C. for 2 hours to 10 hours under a protective atmosphere of air or nitrogen;
cooling in the furnace to room temperature to obtain a sintered sample; and
ball-milling, water-washing and sieving the sample to obtain the red light and near-infrared light-emitting material.

18. A preparation method of the red light and near-infrared light-emitting material according to claim 4, comprising:
weighing raw materials $Sc_2O_3$, $Ga_2O_3$ and $R_2O_3$ according to stoichiometric ratios of molecular formula;
placing the aforementioned raw materials into a crucible after grinding and evenly mixing, and sintering the raw materials in a high-temperature furnace at a temperature of 1200° C. to 1600° C. for 2 hours to 10 hours under a protective atmosphere of air or nitrogen;
cooling in the furnace to room temperature to obtain a sintered sample; and
ball-milling, water-washing and sieving the sample to obtain the red light and near-infrared light-emitting material.

19. A preparation method of the red light and near-infrared light-emitting material according to claim 5, comprising:
weighing raw materials $Sc_2O_3$, $Ga_2O_3$ and $R_2O_3$ according to stoichiometric ratios of molecular formula;
placing the aforementioned raw materials into a crucible after grinding and evenly mixing, and sintering the raw materials in a high-temperature furnace at a temperature of 1200° C. to 1600° C. for 2 hours to 10 hours under a protective atmosphere of air or nitrogen;
cooling in the furnace to room temperature to obtain a sintered sample; and
ball-milling, water-washing and sieving the sample to obtain the red light and near-infrared light-emitting material.

\* \* \* \* \*